(12) United States Patent
Lee

(10) Patent No.: US 8,077,463 B2
(45) Date of Patent: Dec. 13, 2011

(54) HEAT DISSIPATING SYSTEM

(75) Inventor: Mario John Dominic Lee, City of Industry, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 207 days.

(21) Appl. No.: 12/584,416

(22) Filed: Sep. 3, 2009

(65) Prior Publication Data

US 2010/0300652 A1    Dec. 2, 2010

(30) Foreign Application Priority Data

May 27, 2009    (CN) .......................... 2009 1 0302688

(51) Int. Cl.
*H05K 7/20* (2006.01)
*F28D 15/00* (2006.01)

(52) U.S. Cl. .................. 361/700; 165/104.33; 361/702; 361/711

(58) Field of Classification Search .................. 361/702, 361/711

See application file for complete search history.

(56) References Cited

U.S. PATENT DOCUMENTS

| | | | | |
|---|---|---|---|---|
| 5,365,749 | A * | 11/1994 | Porter | 62/259.2 |
| 5,509,468 | A * | 4/1996 | Lopez | 165/144 |
| 6,967,842 | B2 * | 11/2005 | Aoki et al. | 361/701 |
| 6,972,365 | B2 * | 12/2005 | Garner | 174/16.3 |
| 7,203,063 | B2 * | 4/2007 | Bash et al. | 361/699 |
| 2004/0080907 | A1 * | 4/2004 | Belady et al. | 361/687 |
| 2004/0250992 | A1 * | 12/2004 | Aoki et al. | 165/80.3 |
| 2007/0159797 | A1 * | 7/2007 | Teneketges et al. | 361/699 |
| 2008/0259566 | A1 * | 10/2008 | Fried | 361/699 |
| 2009/0244830 | A1 * | 10/2009 | Wyatt et al. | 361/679.47 |

* cited by examiner

*Primary Examiner* — Gregory Thompson
(74) *Attorney, Agent, or Firm* — Altis Law Group, Inc.

(57) ABSTRACT

A heat dissipating system includes an electronic device, a refrigeration device, a thermal connector, a cold plate, and a pipe. The cold plate is located in the electronic device for absorbing the heat. The refrigeration device is capable of refrigerating a coolant. The thermal connector is in contact with the cold plate. The pipe connects the thermal connector to the refrigeration device so that the coolant is capable of flowing out of the refrigeration device to the thermal connector and back to the refrigeration device.

15 Claims, 2 Drawing Sheets

HEAT DISSIPATING SYSTEM

BACKGROUND

1. Technical Field

The present disclosure relates to heat dissipating systems, and particularly to a heat dissipating system employing a liquid.

2. Description of Related Art

A heat dissipating device is usually needed in an electronic device for dissipating heat generated in the electronic device. For example, a fan and a heat sink are located in a server system. However, developments in the industry have produced faster components, which produce more heat, and a fan and a heat sink fail to meet the needs of these new components.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
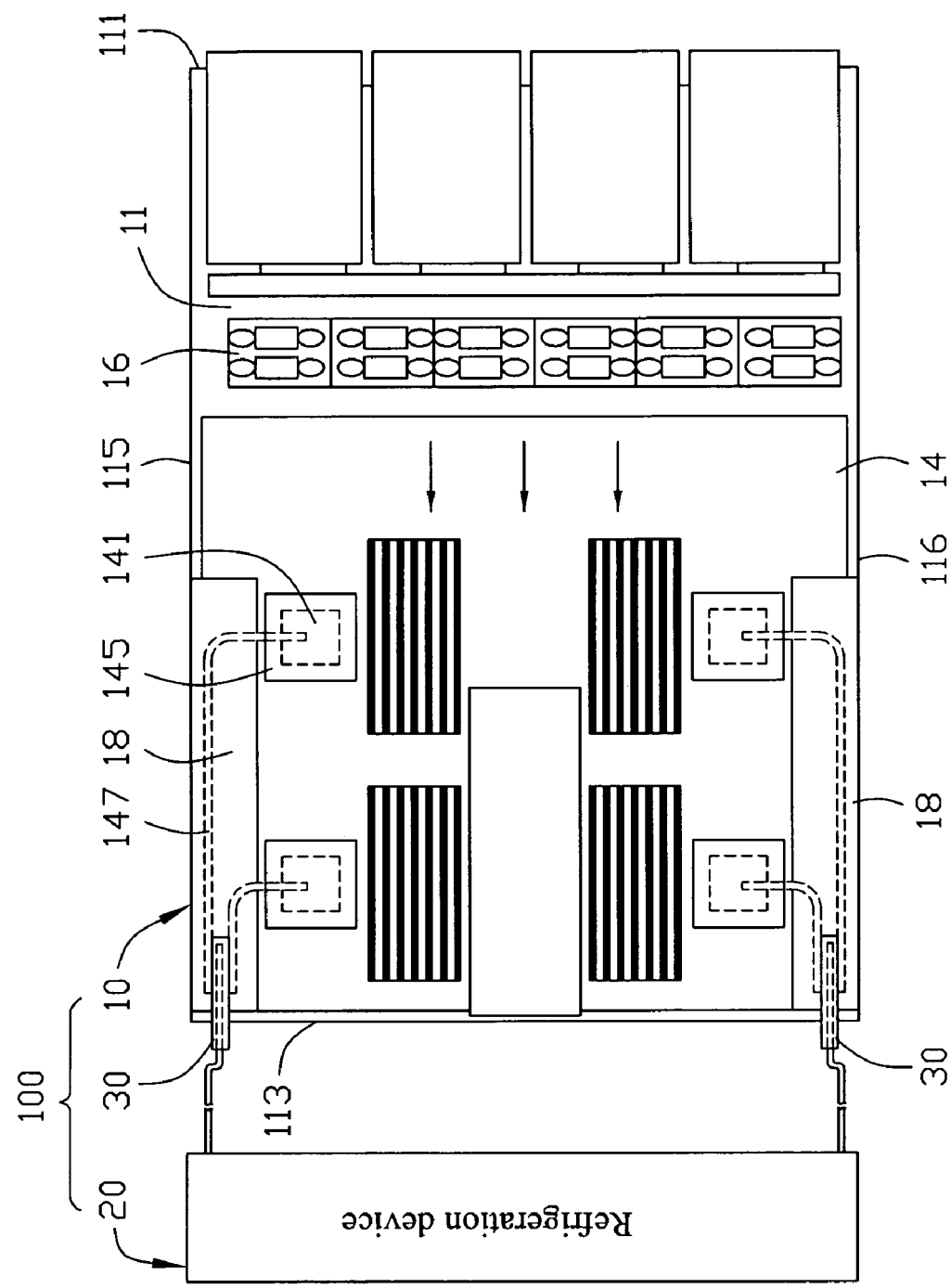
FIG. 1 is a top view of a heat dissipating system, in accordance with an embodiment.
Figure 2:
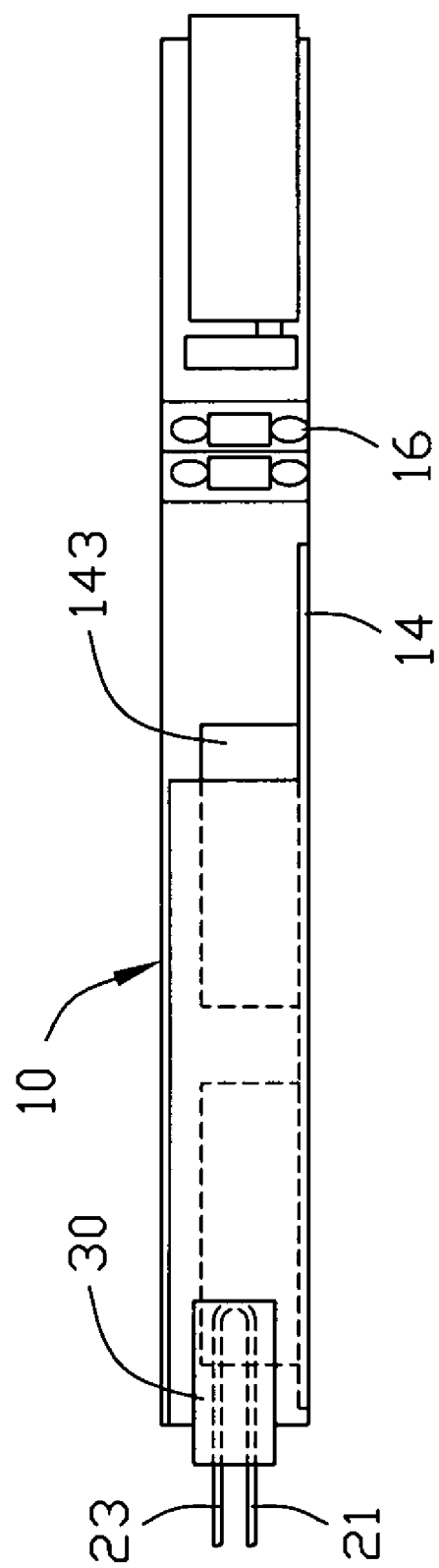
FIG. 2 is side view of the heat dissipating system of FIG. 1, but not showing the refrigeration device.

Referring to FIGS. 1-2, a heat dissipating system 100 in accordance with an embodiment includes an electronic device 10, a refrigeration device 20, and two thermal connectors 30.

The electronic device 10 may be, for example, a computer, a server, or other electronic device, and includes a chassis 11. The chassis 11 includes a front plate 111, a rear plate 113 parallel to the front plate 111, and first and second side plates 115, 116 both perpendicular to the front plate 111. A motherboard 14 is secured in the chassis 11 adjacent the rear plate 113. A plurality of fans 16 arranged in two lines is secured in the chassis 11 between the front plate 111 and the motherboard 14, and the fans 16 are capable of directing airflow (designated by arrow in FIG. 1) from the front plate 111 to the rear plate 113. Two cold plates 18 are secured in the chassis 11 and respectively abut the first and second side plates 115, 116. Each of the cold plates 18 may be, for example, made of material that can quickly absorb heat transferred to the cold plate 18, and quickly transfer heat from a portion of the cold plate 18 with higher temperature to another portion of the cold plate 18 with lower temperature. Two CPUs 141 and a plurality of memory cards 143 are located on each one of two opposite sides of the motherboard 14 and adjacent to the side plates 115, 116.

A heat sink 145 and a plurality of heat pipes 147 are located on each of the CPUS 141. The heat sink 145 is capable of absorbing heat generated from the corresponding CPU 141, and quickly dissipates the absorbed heat in the chassis 11.

Each heat pipe 147 is connected to the heat sink 145 and the cold plates 18. Each heat pipe 147 is typical heat pipe, and may be, for example, made of material, such as copper or aluminum, which is capable of transferring large quantities of heat with very small differences in temperature between the hotter and colder interfaces. Inside a heat pipe 147, at the hot interface a fluid turns to vapor and the gas naturally flows and condenses on the cold interface. The liquid falls or is moved by capillary action back to the hot interface to evaporate again and repeat the cycle. In one embodiment, the heat pipe 147 is capable of transferring heat to the corresponding heat sink 145 and the corresponding cold plate 18.

The refrigeration device 20 is capable of refrigerating a coolant, and connecting to each cold plate 18 with an inlet pipe 21, an outlet pipe 23 (shown in FIG. 2), and a thermal connector 30. The coolant may be a liquid and is capable of flowing in the refrigeration device 20 via the inlet pipe 21, and flowing out of the refrigeration device 20 via the outlet pipe 23.

The thermal connector 30 may be, for example, made of material, which has character capable of quickly absorbing heat transferred to the thermal connector 30, and quickly transferring heat from a portion with higher temperature to another portion with lower temperature of the thermal connector 30. The thermal connector 30 is configured for connecting the inlet pipe 21 and the outlet pipe 23, so that the liquid is capable of flowing from the outlet pipe 23 to the outlet pipe 21. The thermal connector 30 is configured for being embedded in or in contact with the cold plate 18, thereby absorbing heat transferred from the cold plate 18 to the thermal connector 30.

In use, the electronic device 10 and the refrigeration device 20 start to work and the CPUs 141 generate heat. The heat sinks 145 absorb the heat from the CPUs 141, and dissipate the absorbed heat in the chassis 11. The fans 16 direct airflow from the front plate 111 to the rear plate 113, so as to transport some heat out of the chassis 11. At the same time, the heat pipes 147 transfer the heat from the corresponding heat sinks 145 to the corresponding cold plates 18. The cold plates 18 can also collect heat in the chassis 10 and absorb the heat transferred from the heat pipes 147, and transfer the heat to the corresponding thermal connectors 30. The liquid flows out of the refrigeration device 20 to the corresponding cold plates 18 via the outlet pipes 23, thereby absorbing heat from the thermal connectors 30, and flows into the refrigeration device 20 from the thermal connector 30 via the inlet pipes 21. Due to circulation of the liquid between the refrigeration device 20 and the thermal connector 30, the heat can be transferred from the thermal connector 30 to the refrigeration device 20, the liquid is then refrigerated by the refrigeration device 20, and flows out of the refrigeration device 20 again. Therefore, the heat generated by the CPUs 141 or other electric elements can be quickly removed from the chassis 11.

In the embodiment, in order to increase contact surface area between the thermal connectors 30 and the corresponding cold plates 18, the cross section of each thermal connector 30 may be, for example, V-shaped, rectangular, wedge-shaped, or other shape.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipating system comprising:
a cold plate located within a chassis of an electronic device;
a refrigeration device capable of refrigerating a coolant therein;
a thermal connector embedded in the cold plate; and
a heat pipe containing the coolant, the heat pipe connecting with the thermal connector and the refrigeration device so that the coolant is capable of flowing out of the refrigeration device to the thermal connector and back to the refrigeration device.

2. The heat dissipating system of claim 1, further comprising a heat sink capable of dissipating heat generated from an electronic element in the electronic device; a heat pipe connects the heat sink to the cold plate.

3. The heat dissipating system of claim 2, wherein the heat pipe is embedded in the cold plate.

4. The heat dissipating system of claim 2, wherein the heat pipe extends to the thermal connector.

5. The heat dissipating system of claim 2, wherein the electronic element is located on a motherboard.

6. The heat dissipating system of claim 1, wherein the cold plate is located on the chassis.

7. The heat dissipating system of claim 1, wherein a cross section of the thermal connector is rectangular.

8. The heat dissipating system of claim 5, wherein the chassis comprises a front plate and a rear plate, and the motherboard is secured between the front plate and the rear plate; a plurality of fans is secured to the chassis, and the motherboard is located between the plurality of fans and the refrigeration device.

9. A heat dissipating system comprising:
a cold plate located in a chassis of an electronic device;
a thermal connector embedded in the cold plate;
a refrigeration device capable of refrigerating a coolant; and
a heat pipe inserted into the chassis to connect the cold plate with the refrigeration device so that the coolant is capable of circulating between the refrigeration device and the cold plate through the thermal connector.

10. The heat dissipating system of claim 9, further comprising a thermal connector contacting the pipe with the cold plate.

11. The heat dissipating system of claim 10, further comprising a heat sink capable of dissipating heat generated from an electronic element in the electronic device; a heat pipe connects the heat sink to the cold plate.

12. The heat dissipating system of claim 11, wherein the heat pipe is embedded in the cold plate.

13. The heat dissipating system of claim 11, wherein the heat pipe extends to the thermal connector.

14. The heat dissipating system of claim 9, wherein a cross section of the thermal connector is rectangular.

15. The heat dissipating system of claim 11, wherein the electronic element is located on a motherboard, the chassis comprises a front plate and a rear plate, and the motherboard is secured between the front plate and the rear plate; a plurality of fans is secured to the chassis, and the motherboard is located between the plurality of fans and the refrigeration device.

* * * * *